(12) United States Patent
Nishiyama et al.

(10) Patent No.: US 7,449,690 B2
(45) Date of Patent: *Nov. 11, 2008

(54) INSPECTION METHOD AND INSPECTION APPARATUS USING CHARGED PARTICLE BEAM

(75) Inventors: Hidetoshi Nishiyama, Higashiyamato (JP); Muneyuki Fukuda, Kokubunji (JP); Noritsugu Takahashi, Hitachinaka (JP); Mitsugu Sato, Hitachinaka (JP); Atsuko Fukada, Kokubunji (JP); Naomasa Suzuki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 357 days.

This patent is subject to a terminal disclaimer.

(21) Appl. No.: 11/349,974

(22) Filed: Feb. 9, 2006

(65) Prior Publication Data

US 2006/0186351 A1 Aug. 24, 2006

(30) Foreign Application Priority Data

Feb. 18, 2005 (JP) ............................. 2005-041531

(51) Int. Cl.
*G01N 23/00* (2006.01)
*G21K 7/00* (2006.01)

(52) U.S. Cl. .................... 250/310; 250/307; 250/492.1; 250/492.21; 250/492.3; 250/559.3; 250/208.1; 250/398; 250/442.11; 702/70; 427/140

(58) Field of Classification Search ................ 250/310, 250/307, 492.1, 492.21, 492.3, 559.3, 208.1, 250/398, 442.11; 702/70; 427/140

See application file for complete search history.

(56) References Cited

U.S. PATENT DOCUMENTS

2006/0243906 A1* 11/2006 Fukada et al. ............... 250/307

FOREIGN PATENT DOCUMENTS

| JP | 08-273569 | 10/1996 |
|----|-----------|---------|
| JP | 2000-030654 | 1/2000 |

* cited by examiner

*Primary Examiner*—Jack I Berman
*Assistant Examiner*—Meenakshi S Sahu
(74) *Attorney, Agent, or Firm*—Antonelli, Terry, Stout & Kraus, LLP.

(57) ABSTRACT

To establish a technique that enables sorting of the elevation and azimuth angle in the direction of emitting secondary electrons and obtaining images with emphasized contrast, in order to perform the review and analysis of shallow asperities and microscopic foreign particles in a wafer inspection during the manufacture of semiconductor devices, an electromagnetic overlapping objective lens is used to achieve high resolution, an electron beam is narrowly focused using the objective lens, an electric field for accelerating secondary electrons in the vicinity of a wafer in order to suppress the dependence on secondary electron energy of the rotation of secondary electrons generated by irradiation of the electron beam, a ring-shaped detector plate is disposed between an electron source and the objective lens, and the low angle components of the elevation angle of the secondary electrons, as viewed from the place of generation, and the high angle components are separated and also the azimuth components are separated and detected.

20 Claims, 10 Drawing Sheets

UNIT mm

FIG. 4C

UNIT mm

FIG. 4D

POINT OF DETECTOR PLATE ELECTRON HITTING ON [mm] vs ELEVATION [DEGREE]

FIG. 4E

SHADOW CONTRAST vs MINIMUM ELEVATION ANGLE OF DETECTABLE ELECTRON [DEGREE]

VERTICAL AXIS (Z): NORMAL TO PAPER SURFACE

INSPECTION METHOD AND INSPECTION APPARATUS USING CHARGED PARTICLE BEAM

CLAIM OF PRIORITY

The present application claims priority from Japanese application JP 2005-041531 filed on Feb. 18, 2005, the content of which is hereby incorporated by reference into this application.

FIELD OF THE INVENTION

The present invention relates to a manufacturing method and apparatus for substrates having microscopic circuit patterns, such as semiconductor devices and liquid crystal devices, and more specifically to the pattern inspection technology for semiconductor devices and photomasks. Further specifically, the present invention relates to a review SEM whereby, after an optical imaging based or electron beam based defect inspection of an arbitrary area on an unfinished wafer during the manufacturing process of semiconductor devices, a defect review is performed with high resolutions based on the defect coordinate.

BACKGROUND OF THE INVENTION

A semiconductor device is manufactured by repeating a process of transferring patterns formed with photomasks on the surface of a wafer by means of lithography or etching. In this manufacturing process, in order to realize early boosting of yield and stable operation of the manufacturing process, it is essential to rapidly analyze a defect found by an inline wafer inspection and use the result for countermeasures. The key to rapid application of the analysis result to countermeasures for defects is an automated defect review and classification technology whereby a large number of defects are rapidly reviewed and classified according to the causes. As the manufacturing process becomes microminiaturized, defect sizes affecting the yield of semiconductor are becoming micromiatuarized, and consequently it is becoming difficult for an optical review apparatus to perform a review with high resolution. To address this problem, SEM (Scanning Electron Microscope) based review apparatuses capable of reviewing at high speeds and with high resolution have been commercialized. In such apparatuses, it is important for detection of microscopic foreign particles or scratches to obtain a shadow image from an SEM image, which is equivalent to a shadow made when those objects are irradiated from the side.

Figure 2A:
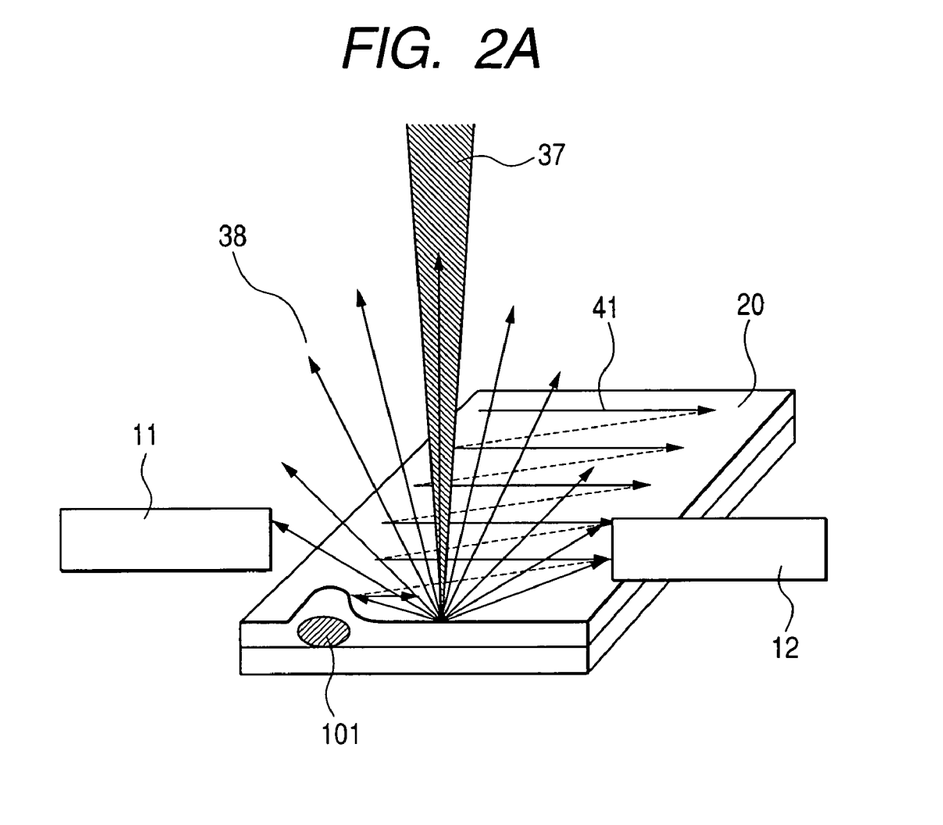
FIGS. 2A, 2B, and 2C show the principle of forming a shadow image.
Figure 2B:
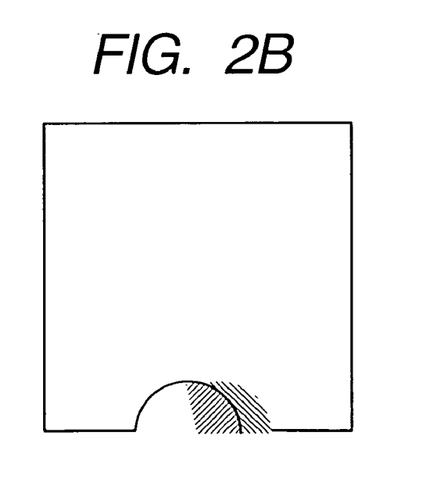
Figure 2C:
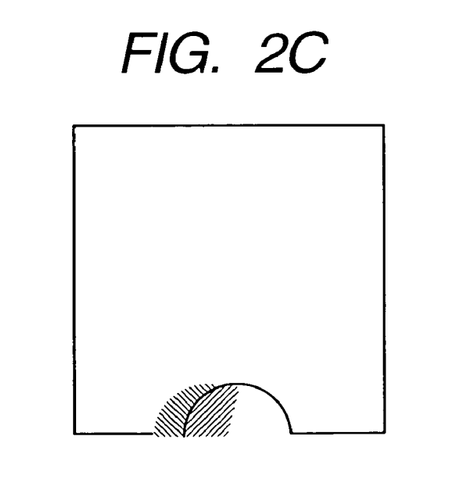

The basic principle of obtaining such a shadow will be described with reference to FIGS. 2A to 2C. A bump 101 created by a foreign particle in the film is scanned as shown by 41 with an electron beam 37, and when the electron beam 37 is scanning the right side of the bump 101 secondary electrons 38 are emitted. At this time, noting a low angle component of the elevation angle, some of the secondary electrons emitted at the left side are hidden by the bump 101. Because of this, the number of secondary electrons detected is different between right and left detector plates 11 and 12. Thus, the images detected by the detector plate 11 and 12 will be ones whose shadows are emphasized as shown in FIGS. 2B and 2C, respectively.

An example is described in JP-A No. 273569/1997 that is intended to achieve high resolution needed for detecting microscopic asperity based on this principle. An electromagnetic overlapping objective lens is used to achieve high resolution. In this case, secondary electrons emitted from the specimen rotate and cause energy distribution, and their rotation angles differ depending on the energy. As a result, even a secondary electron emitted at a certain azimuth will lose its directional information after it has passed through the objective lens. Therefore, the directional information is preserved by generating an electric field near the wafer to accelerate secondary electrons, and causing the secondary electrons to pass through a magnetic field generated by the objective lens at high speeds, whereby to reduce the energy distribution. Furthermore, by controlling the trajectories of secondary electrons and back scattering electrons, secondary electrons are detected by a ring-shaped detector plate disposed between electron source and objective lens; specifically back scattering electrons are detected by the inner ring and secondary electrons by the outer ring. The outer ring is divided into four parts in a fan-like form and the azimuths of secondary electrons can be selected, making it possible to obtain shadow images.

An example of selecting the elevation angle components is described in JP-A No. 30654/2000. In this example, two detector plates are disposed at locations shifted from each other in the direction of light axis, with the distance between the detector plates being at least 25% of the distance between the specimen side detector plate and the focal plane of the objective lens. This allows the selection of detected electrons based on the emission angles of emitted electrons.

SUMMARY OF THE INVENTION

To detect shallow asperities, microscopic foreign particles, and the like, it is important to emphasize the shadow contrast by selecting detected azimuths and elevation angles, and obtain high quality images without shading.

In JP-A No. 273569/1997, however, all the elevation angle components (0 to 90 degrees) are detected for emitted secondary electrons, and consequently the shadow contrast lowers, making it impossible to emphasize the contrast. For shallow asperities, the shadow contrast is low and defect detection may fail. Moreover, since the ring-shaped detector plates must perform the azimuth selection for secondary electrons, it is necessary to dispose the ring-shaped detector plates symmetrically relative to the light axis along which a primary electron beam passes. However, if the detector plates are not disposed symmetrically due to a problem with mechanical precision, shading occurs in a shadow contrast image.

As for JP-A No. 30654/2000, the selection of elevation angles is performed but azimuths cannot be separated, making it impossible to obtain shadow images.

Because of these problems described above, it was difficult to detect shallow asperities and the like with the prior arts.

An electromagnetic overlapping objective lens is used to achieve high resolution. An electron beam is narrowly focused using this objective lens to irradiate the electron beam onto a specimen. In order to suppress the dependence, on secondary electron energy, of the rotation of secondary electrons generated from the specimen, an electric field is applied near the wafer to accelerate the secondary electrons. Furthermore, a ring-shaped detector plate is provided between electron source and objective lens to sort out the low angle components and high angle components of the elevation angle of the secondary electrons where they are generated, as well as azimuth angel components, and detect them. The problem with mechanical precision that arises in designing a ring-shaped detector plate is solved either by make the detector plate movable or by controlling the trajectories of secondary electrons with an EXB (Wien filter) disposed on the trajectories of secondary electrons that orthogonalizes electric field and magnetic field on the trajectories of secondary electrons.

According to the present invention, it is possible to obtain an image with emphasized shadow contrast during the inspection of a semiconductor device and the like having circuit patterns, and thereby detect shallow asperities, microscopic foreign particles, etc. with high sensitivity. It is also possible to detect with high sensitivity, review, and classify defects, thus allowing the causes of defects to be easily determined.

DETAILED DESCRIPTION OF THE PREFERRED EMBODIMENTS

Figure 3:
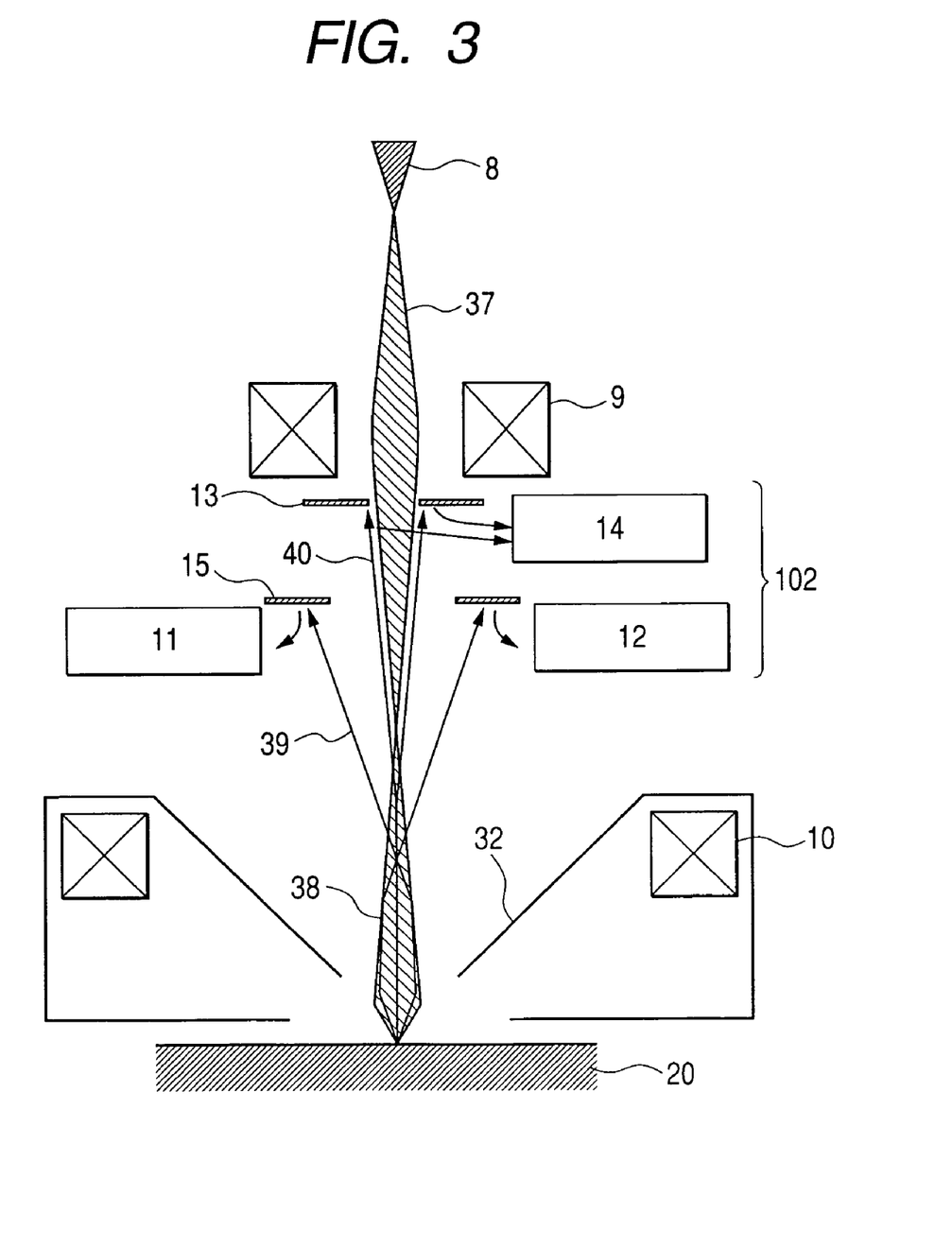
FIG. 3 is a diagram illustrating a method of obtaining a shadow image according to the present invention.

One embodiment of the present invention will be described with reference to FIG. 3. This is an apparatus comprising an electron source 8, an objective lens 10, a specimen 20, an electrode disposed in contraposition to the specimen, and a detection system 102 disposed between electron source and objective lens. The detection system 102 consists of upper and lower reflector plates 13, 15, detector plates 11, 12, 14, and the like.

Figure 4A:
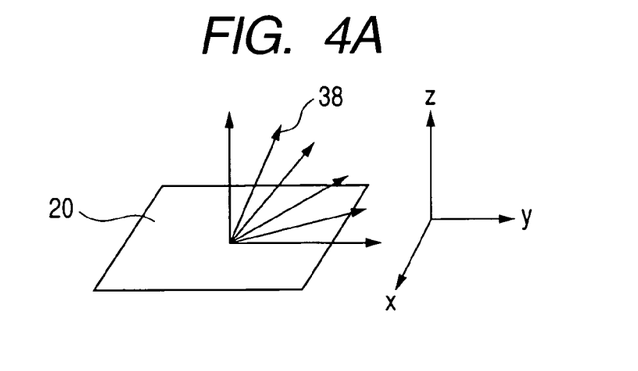
FIGS. 4A, 4B, 4C, 4D and 4E show a secondary electron trajectory calculation results.
Figure 4B:
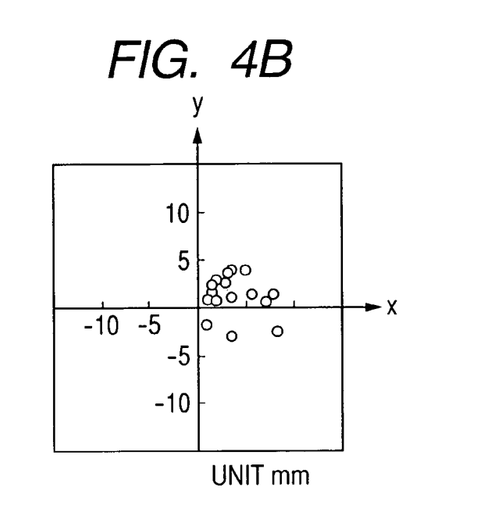
Figure 4C:
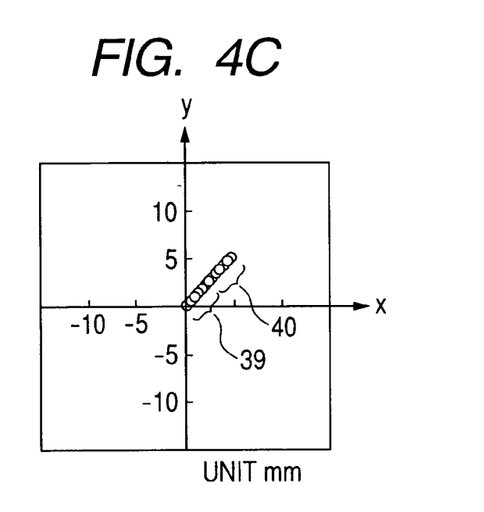

Here, The energy distribution of secondary electrons that are generated when an electron beam 37 emitted from the electron source 8 is irradiated on a wafer 20 is assumed to be, for example, approximately 0 to 20 eV. The generated secondary electrons 38 are rotated by a magnetic field generated by the objective lens 38 and travel towards the reflector plates 13, 15. At this time, if the secondary electrons pass through the magnetic field at low speeds, the rotation angle of the secondary electrons 38 depend on the energy of the secondary electrons, and consequently the directional information when they were generated will be lost. For example, if secondary electrons are emitted from the specimen at elevation angles of 0 to 90 degrees and on the y-z plane as shown in FIG. 4A, the spots on the reflector 15 to which the secondary electrons reach are as shown in FIG. 4B, indicating that their directional information is lost. Therefore, in order to suppress the dependence, on secondary electron energy, of the rotation angles of secondary electrons, the secondary electrons 38 is caused to pass through the magnetic field at high speed by applying sufficiently large positive electrical potential to the electrode 32 facing the wafer. As a result, the secondary electrons is able to reach the detector plate without depending on the secondary electron energy, i.e., without losing the original directional information, resulting in the directional information being maintained and the distribution becoming a linear distribution. Since directional information is thus maintained, required electric field was fifth power of 10 V/m. Also, it is necessary to make the electric field sixth power of 10 V/m or less in order to prevent discharge breakdown of the wafer.

Figure 4D:
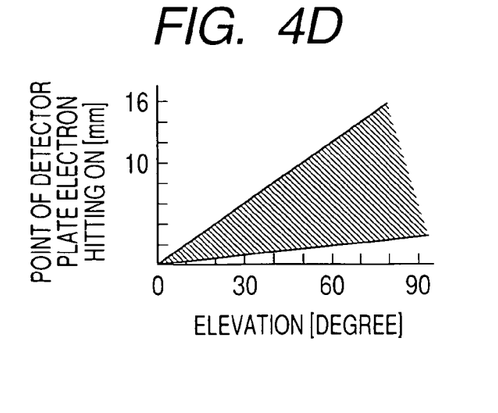

On a plane (x-y plane) perpendicular to the light axis (z axis) of primary electrons, when an angle formed between this plane and the emitted direction of a secondary electron is defined as elevation angle, a secondary electron 39 with large elevation angle reaches near the center of the plane and a secondary electron with small elevation angle reaches away from the center. Under the abovementioned electric field conditions of from the fifth power of 10 to the sixth power of 10, the secondary electrons reach the detector plate within the shaded area shown in FIG. 4D.

Here, if a reflector plate is formed to have an opening in the center just like a reflector plate 15 shown at (a) in FIG. 5, it is possible to limit the elevation angle components impinging on the reflector plate 15 by changing the shape of the opening. Since secondary electrons impinging on the reflector plate 15 are directional, it is possible to draw into the detector plates 12, 13 the secondary electrons generated as a result of impinging on the right or left side of the reflector 15, by applying a 50 V electrical potential to a mesh 103. At this time, a partition 104 shown at (b) in FIG. 5 may be disposed to prevent the secondary electrons at the right and left sides of the reflector plate from being mixed. The secondary electrons having passed through the reflector 15 impinge on the reflector 13 to cause secondary electrons to be generated, and the generated secondary electrons can be drawn into the detector plate 14 by applying a 50 V electrical potential to the mesh 103. An image that can be obtained here is an object contrast image that results from the differences in secondary electron discharge efficiency, and does not contribute to the shade of an image.

Figure 4E:
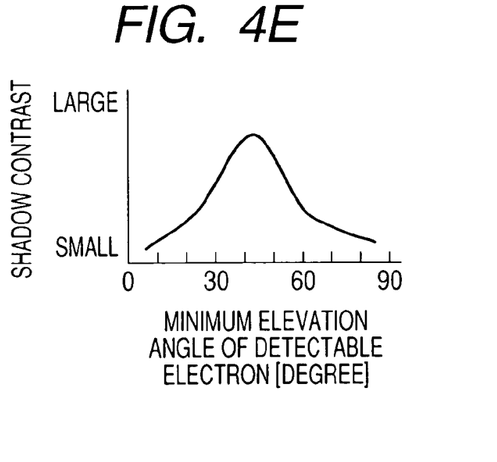

To emphasize shadow contrast, it is necessary to optimize the diameter of an opening formed in the reflector plate 15. FIG. 4E shows the result of changing the diameter and the minimum elevation angle (minimum elevation angle of detected electrons) of the secondary electrons impinging on the reflector plate. It is referable to detect secondary electrons with elevation angles of 45 degrees or less, in order to achieve the highest contrast. Accordingly, from in FIG. 4D, the diameter of an opening to be formed in the reflector plate 15 becomes most optimal when point of detector plate electron hitting on is 1 to 10 mm at an elevation angle of 45 degrees.

Figure 5A:
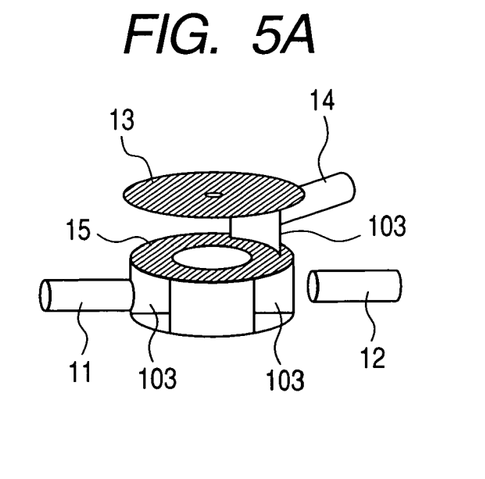
FIGS. 5A, 5B, 5C, and 5D show a secondary electron detector plate.
Figure 5B:
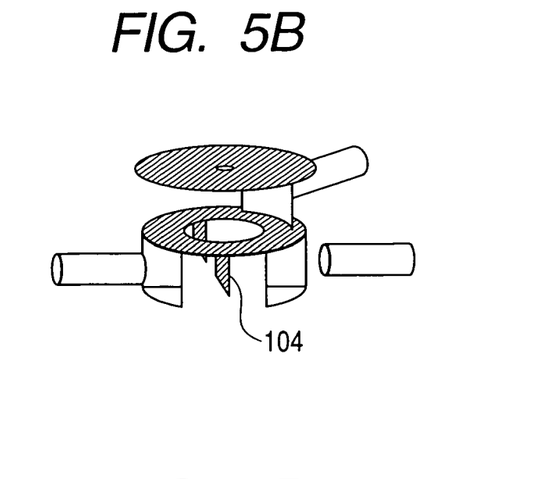
Figure 5C:
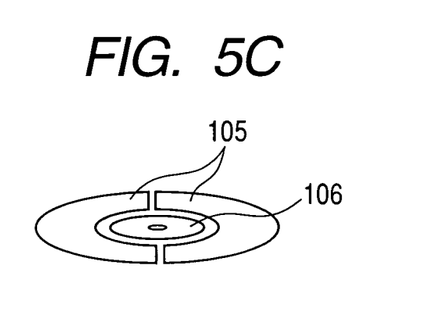
Figure 5D:
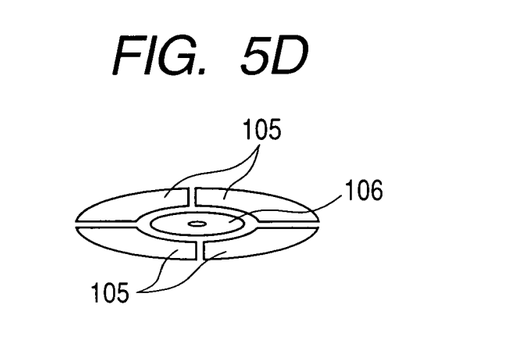

Also, a similar effect can be achieved by forming this reflector plate of a multichannel plate or scintillator and directly detecting secondary electrons generated in the wafer. Examples of the construction of such a detector plate are shown in FIGS. 5C and 5D. In FIGS. 5C and 5D, components with large elevation angles are detected by a detector plate 105 divided into two or four parts, and components with small elevation angles by a detector plate 106.

Figure 7:
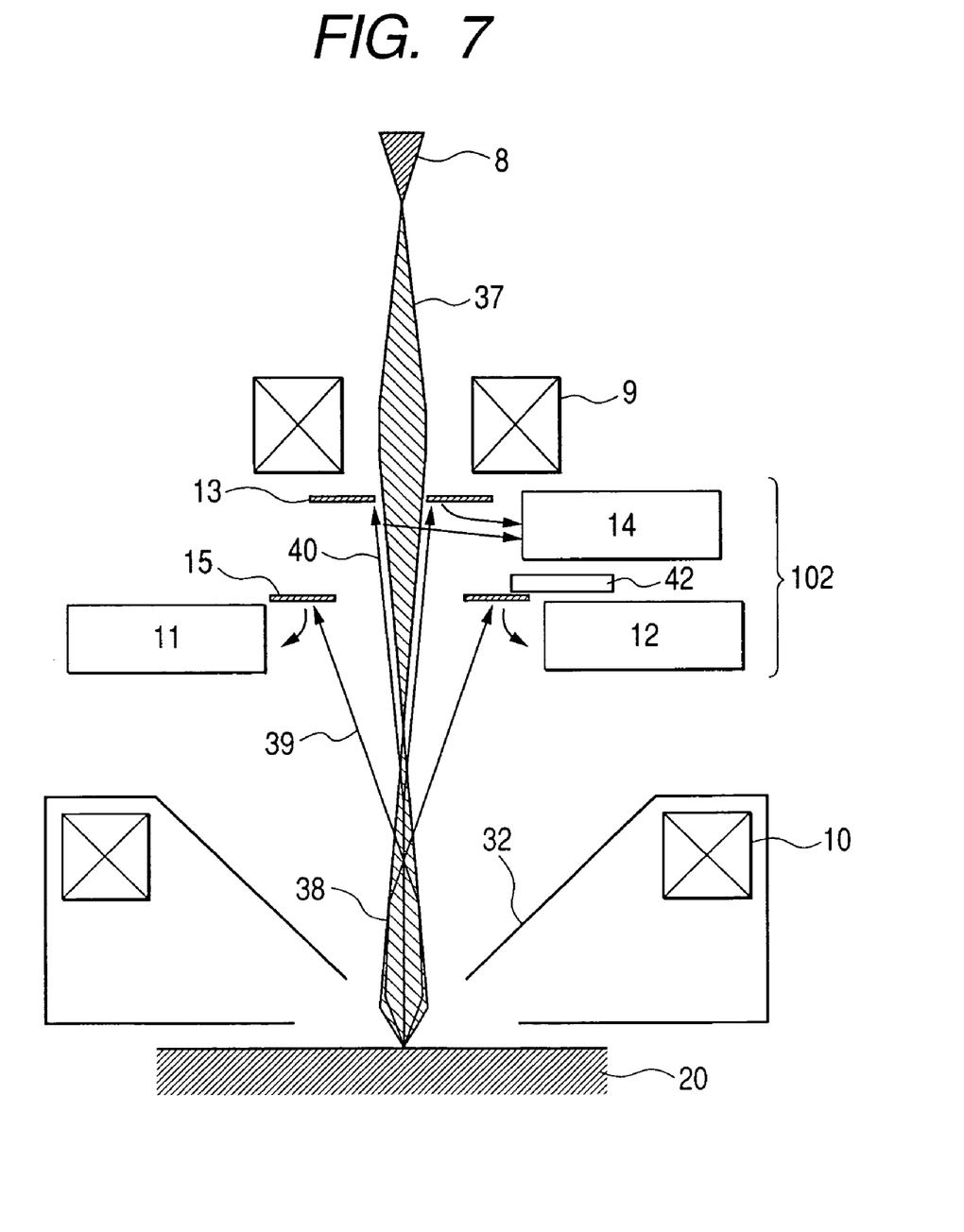
FIG. 7 is a diagram illustrating a movable detector plate according to the present invention.

If ring-shaped detector plates are provided, they must be disposed symmetrically relative to the light axis. In practice, they are not in place due to mechanical precision. To solve this problem, a reflector plate moving mechanism 42 as shown in FIG. 7 is provided. This makes the reflector plate 15 or the detector plates 105, 106 to be used in place of the reflector plate movable. Another solution is to control the trajectories of secondary electrons by providing an EXB (Wien filter) on the trajectories of secondary electrons.

First Embodiment

Figure 1:
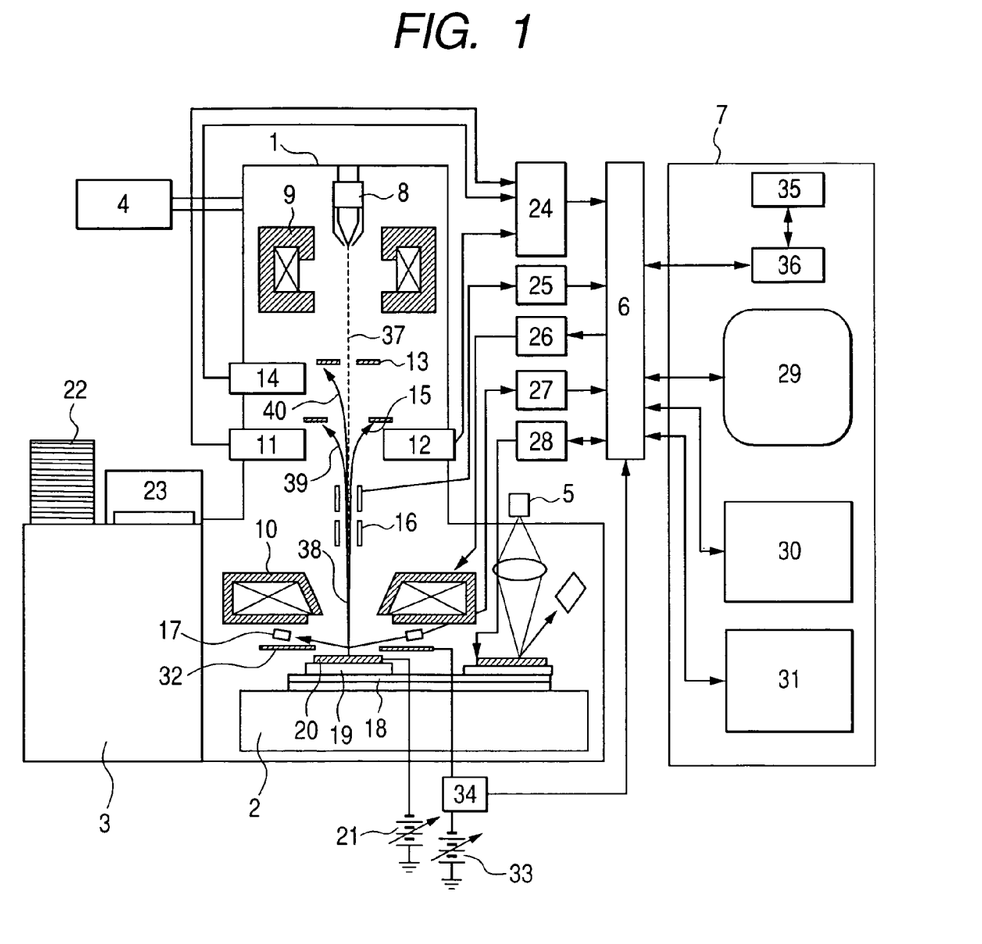
FIG. 1 shows a configuration of a review SEM.

In this embodiment, an example of defect classification using a review SEM. FIG. 1 shows an example configuration of a review SEM. This apparatus comprises an electro-optic system 1, a stage mechanism system 2, a wafer carrying system 3, an evacuation system 4, an optical microscope 5, a control system 6, and an operation unit 7.

The electro-optic system is composed of an electron source 8, a condenser lens 9, an objective lens 10, a first detector plate 11, a second detector plate 12, a first reflector plate 13, a third detector plate 14, a second reflector plate 15, a deflector 16, a wafer height detector 17, an electrode 32 disposed opposite to the stage, an electrode power supply 33, and an electrode power supply control unit 34.

The stage mechanism system 2 includes an XY stage 18, a holder 19 to hold a wafer as a specimen, and a retarding power supply 21 to apply a negative voltage to the holder 19 and wafer 20. To the XY stage 18 is attached a position detector that performs measurements with laser.

The wafer carrying system 3 comprises a cassette holder 22 and a wafer loader 23, and the holder 18 is designed so as to travel between wafer loader 23 and XY stage with the wafer 20 being loaded on it.

The control system 6 comprises a signal detector system control unit 24, a beam deflection correction control unit 25, an electro-optic system control unit 26, a wafer height sensor detection system 27, and a mechanism and stage control unit 28. The operation unit 7 is composed of an operation screen and operation panel 29, an image processing unit 30, and an image and inspection data storage unit 31.

Now, the operations of respective units shown in FIG. 1 is described. First, a wafer cassette containing the wafer on its shelf is loaded on the cassette holder 22 of the wafer carrying system 3. Then, the shelf number of the cassette on which the wafer 20 is set is specified from the operation screen 29, in order to specify the wafer to be reviewed. For review, to observe electron beam images based on the inspection results including the information on positions of defects and the like (defect coordinate data), after inspections are performed by other inspection apparatuses, an inspection results file is selected via the operation screen and operation panel 7. For selection of the file, it is possible to read the inspection results file by means of communication via networks or the like, or to read the file from a medium such as a flexible disk. Either way, various data on the inspection results may be read into a data input unit by specifying the inspection results file name, and then the data format may be converted to a data format or a coordinate system used in the review SEM by a data conversion unit 36. Then, the name of a review condition file is input from the operation screen and operation panel 29. This review condition file contains various parameters to determine the review items. When conditions required to perform a review is entered, an automated review sequence starts.

When a review is started, the wafer set on the cassette is carried into the review apparatus. The wafer carrying system 3 is designed so that it accommodate different sizes and shapes of the wafer by replacing the holder 20 on which the wafer is held, for different diameters of wafers under inspection and for different shapes such as orientation flap type or notch type. The wafer under inspection is loaded onto the holder 19 by the wafer loader 23 consisting of an arm, auxiliary vacuum chamber, and the like, and carried to an inspection chamber with the holder.

After the wafer 20 is loaded, electron beam irradiation conditions are set for respective unit by the electro-optic system control unit, based on the review conditions entered above. Then, an electron beam image of a predetermined area of the wafer is obtained, and focusing and non-focusing is performed on the image. At the same time, the height of the wafer 10 is determined by the wafer height detector 27 and the relationship between the height information and the electron beam focusing conditions is determined, so that focus is automatically adjusted to meet the focusing conditions based on the result of the wafer height detection without performing a focusing each time an electron beam image is obtained subsequently. This made it possible to obtain electron beam images continuously at high speeds.

On completion of the adjustments of electron beam irradiation conditions and focusing and non-focusing, an alignment is performed between two points on the wafer.

The rotation and coordinate values are corrected based on the result of an alignment, and the position of the defect to be reviewed is moved into place based on various information contained in the inspection results file already read into.

Figure 6A:
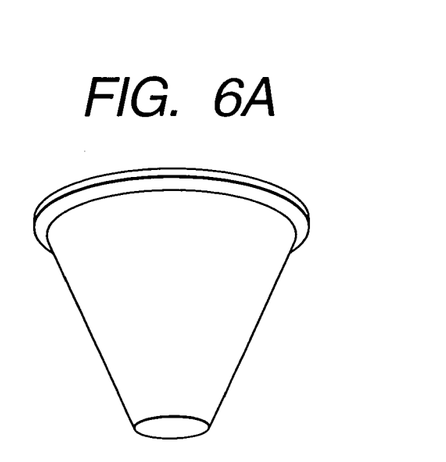
FIGS. 6A and 6B are an example of a reflector plate.
Figure 6B:
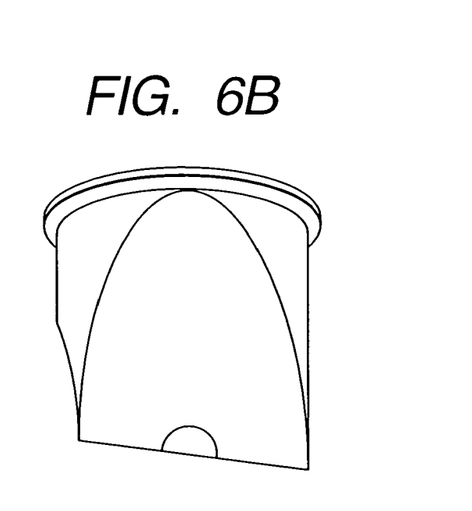

When the defective position is moved into place, a beam irradiation is performed. Since the reflector plates 13, 15 are constructed as shown in FIG. 5A, it is possible to cause low angle components of the discharge elevation angle of secondary electrons to impinge on the reflector plate 15, and high angle components to impinge on the reflector plate 13 after passing them through the opening formed in the reflector plate 15. Low elevation angle components of secondary electrons depend on azimuth components, and therefore are separated right and left and then impinge on the reflector plate. Because of this, out of the secondary electrons newly generated when the secondary electrons impinge on the reflector plates, those near the detector plate 11 go to the detector plate 11, and those near the detector plate 12 go to the detector plate 12. The secondary electrons that impinged on the reflector plate 13 generate secondary electrons there, which are then detected by the detector plate 14. Thus, shallow images with emphasized contrast were obtained by the detector plates 11, 12, and object images were obtained by the detector plate 14. As an example of another reflector plate shape, a type with the partition 104 as shown in FIG. 5A, a funnel type as shown in FIGS. 6A and 6B, or a drip coffee filter type may be employed. This makes it possible to obtain the shadow images as shown in FIGS. 2B and 2C. Also, multichannel plates, semiconductor detector plates, or scintillator may be disposed instead of the reflector plates 13, 15.

The obtained images are saved in the image/data storage unit as needed. It is possible to set in advance whether or not to save the images in the review condition file, or to simultaneously save multiple types of images detected by a plurality of detector plates according to the setting.

At the same time as saving the images, the image processing unit 30 extracts the features of the defect from the image information to automatically classify the defect. The result of classification is coded as a value of, for example, 0 to 255, and the code number is written to the place corresponding to the defect classification code in the inspection results file. Then, the abovementioned defect review process is repeated.

After the abovementioned sequence of operations are completed for all the defects to be reviewed on one wafer, the inspection results file for that wafer (a file in which classification result is written) is automatically saved, and output to a specified device. Then, the wafer is unloaded to finish the review.

Using this method made it possible to detect low angle components and high angle components of the elevation angles of secondary electrons, and additionally azimuth angles separated, and thereby to detect, review, and analyze the defects detected by optical inspection, with high sensitivity.

Second Embodiment

Figure 8:
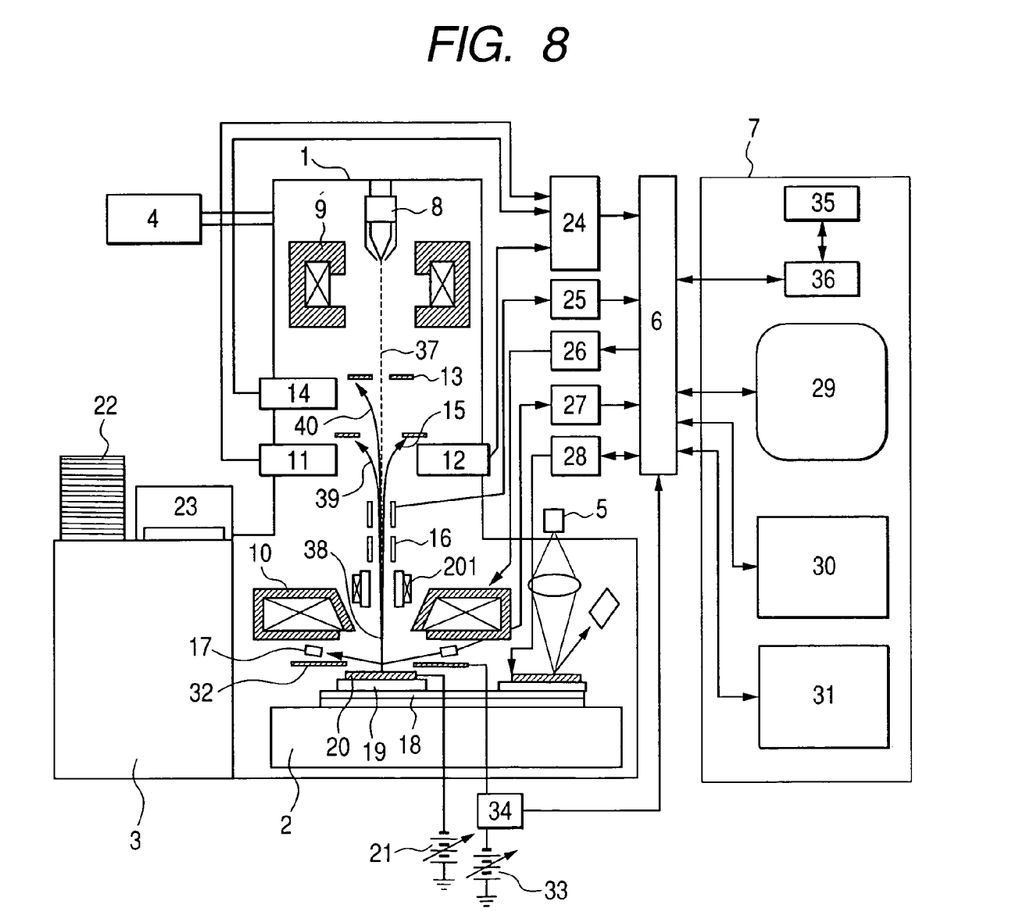
FIG. 8 shows a configuration of a second embodiment.

Now, a second embodiment is described. FIG. 8 shows the configuration of the second embodiment. In this embodiment, a so-called ExB deflector 201 for deflecting secondary electrons is disposed on the light axis of a primary electron beam. The other configuration is the same as that of the first embodiment. The term ExB deflector here is a deflector overlapping electric field and magnetic field, wherein, for the primary electron beam, the amount of deflection by electric field and that of magnetic field are set so that they become the same in opposite direction from each other to cancel out the deflection effect of each field, and, electric field and magnetic field acts on secondary electrons in such a direction in which the amount of deflection by electric field becomes equal to that of magnetic field, to thereby deflect only the secondary electrons independently.

Figure 9:
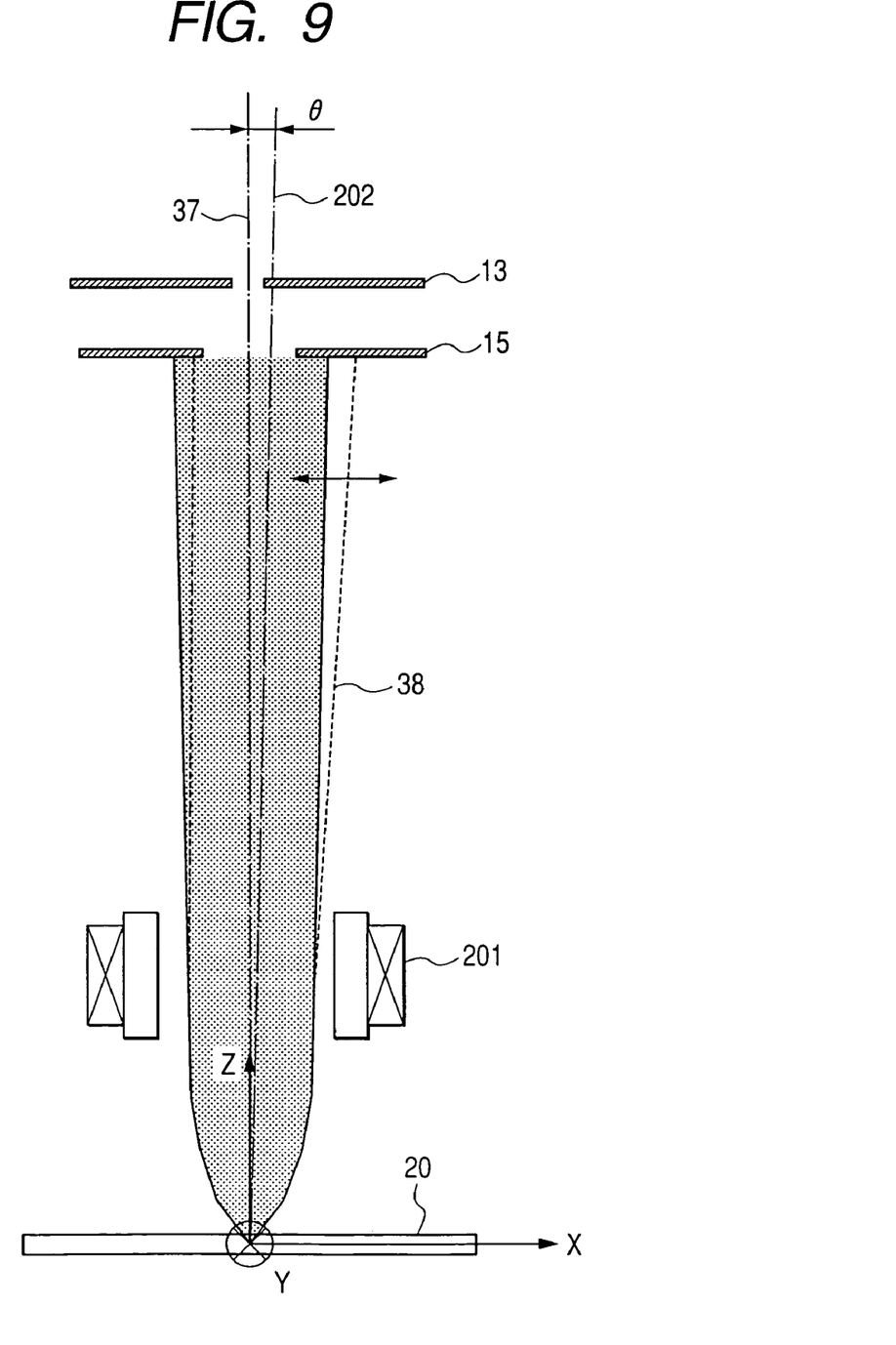
FIG. 9 is a diagram illustrating the operation of the second embodiment.
Figure 10A:
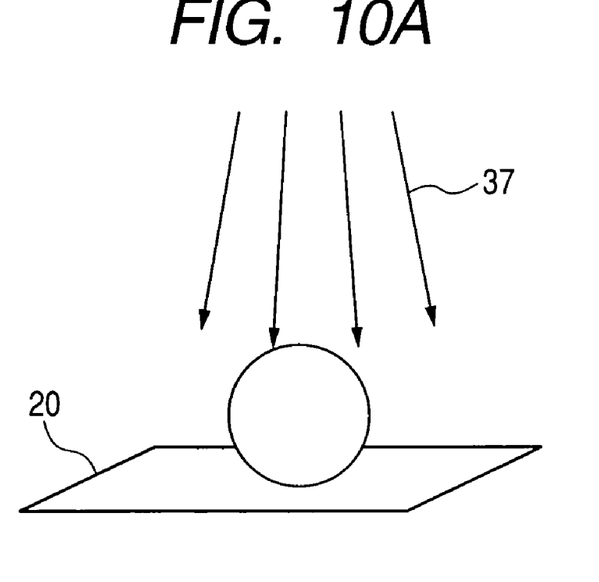
FIGS. 10A and 10B illustrate an adjustment technique of the second embodiment.
Figure 10B:
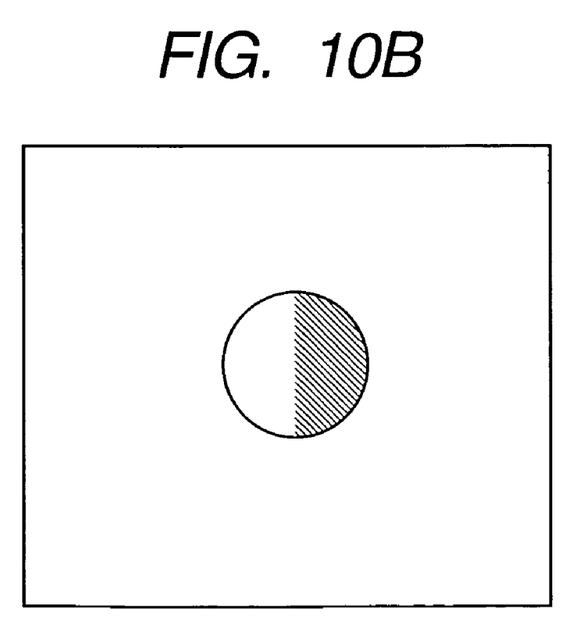

FIG. 9 shows the operation of the second embodiment. The central trajectory 202 of secondary electrons is deflected by operating the ExB deflector 201. This causes the balance among the directional components when secondary electrons 38 impinge on the lower reflector plate 15 to vary.

A background requiring this embodiment is described. In an electro-optic apparatus of the present invention, generally the light axis of a primary electron beam and secondary electrons is slightly inclined relative to the direction normal to the specimen surface depending on the mechanical restraints and/or adjustments of the apparatus. For the primary electron beam, it is common to use the apparatus after adjusting the light axis so that the influence of the inclination of the light axis is minimized. On the other hand, for the secondary electrons, it is enough to be able to detect them efficiently, and there is no need to adjust the inclination of the light axis, generally. In a configuration like the present invention having a detector system that separates the secondary electrons into two or more directional angle components, if the central trajectory is tilted relative to the opening of a reflector plate, the precision in the separating direction of secondary electrons lowers. Therefore, in this embodiment, the balance among the directional components when secondary electrons impinge on the reflector plate 15 is adjusted towards a desired direction, by independently deflecting the light axis of the secondary electrons relative to the axis of the primary electron beam.

When separating the secondary electrons by the reflector plate 15 in right and left directions, if the central trajectory 202 of the secondary electrons passes at the center of the opening of the reflector plate 15, secondary electrons generated from the horizontal surface of a specimen are separated evenly in right and left directions, resulting in the amounts of signal SR and SL obtained by the left and right detector plates becoming SR=SL. On the other hand, if the central trajectory 202 of the secondary electrons is off the center of the opening of the reflector plate, signals from the horizontal surface of a specimen are not evenly separated in right and left directions, thus resulting in SR≠S1. To accurately separate the signals so as to faithfully reflect the shadows of asperities on a specimen as with the present invention, it is important that signals from the specimen are separated evenly in right and left directions.

Therefore, the deflection angle θ by the ExB deflector 201 is adjusted by irradiating the electron beam 37 on a spherical specimen while scanning it, so that exactly the half of the sphere becomes a shadow on an image obtained. By obtaining a shadow image of the specimen to be observed after adjusting such that the amount of right signals SR becomes equal to that of left signals SL, it is possible to faithfully and accurately image the shadows of asperities as shadow contrast.

This adjustment is essential in a case where the apparatus operates under the electro-optic system conditions that secondary electrons are generated from a specimen and then accelerated by the electric field on the specimen, wherein the spread of the secondary electrons become relatively small and the balance between the amount of right signals and that of left signals is lost due to subtle inclination of the axis of secondary electrons. Also, the ExB deflector 201 may be disposed at any position below the reflector plate 15, but as the position is lowered relative to the reflector plate 15, larger adjustment range can be obtained at a small deflection angle θ, and the primary electron beam by the ExB is less affected by deteriorated resolution.

Third Embodiment

Now, a third embodiment is described. The entire configuration is similar to that of the second embodiment shown in FIG. 8. In this embodiment, the ExB deflector is composed of a 4-polar electrode and a magnetic pole, and secondary electrons can be deflected at any azimuth. As a result, it is possible to align the secondary electrons not only in the direction (x direction in FIG. 9) of separating the reflector plate 15 as shown in FIG. 9, but also in the direction (y direction) perpendicular to the surface of the page on which FIG. 9 is drawn. This allows correction of a displacement in the y direction of the central trajectory of secondary electrons relative to the opening of the reflector plate 15. It is also possible to adjust so that secondary electrons impinge on the reflector plate in a desired manner.

Fourth Embodiment

Figure 11:
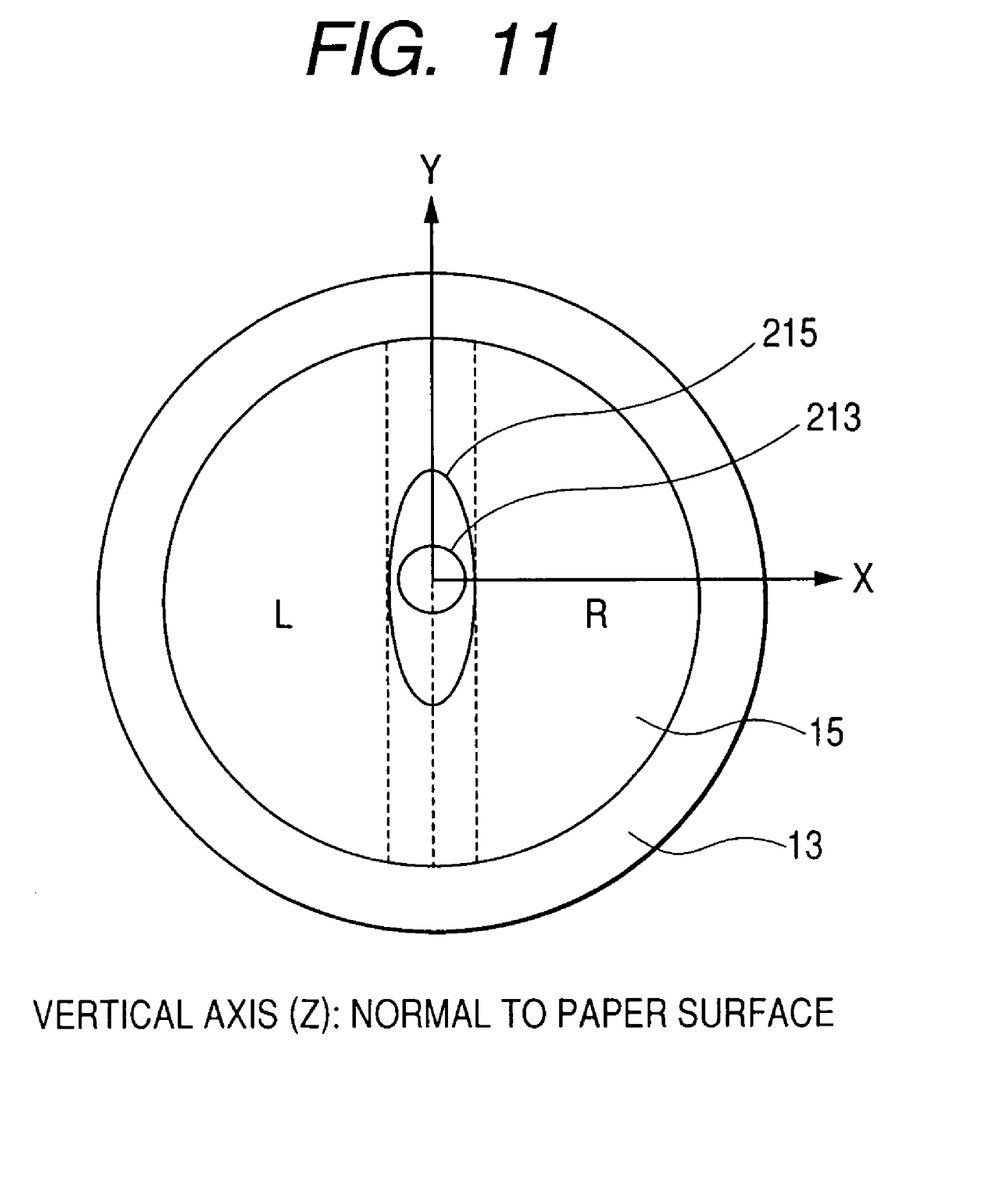
FIG. 11 is a bottom view of the reflector plate of the second embodiment.

Finally, a forth embodiment is described. In this embodiment, the reflector plates 13 and 15 are configured as shown in FIG. 11, as viewed from the specimen side, the other configuration being the same as that of the third embodiment. That is, the direction of separating the secondary electrons by the reflector plate 15 is defined as x direction, the direction perpendicular to the x direction is y direction, and the light axis of the primary electron beam is z direction, and the beam passing opening 215 of the reflector plate 15 is an ellipse whose y direction axis is longer than the x direction axis, and the beam passing opening 213 of the reflector plate 13 is an circle whose diameter is shorter than the minor axis of the 215. Needless to say, the opening 215 of rectangular shape or the like has the same effect and is included in the present invention. This and the 4-polar ExB deflector of the third embodiment are combined to operate.

This embodiment allows the secondary electrons alignment for increasing the accuracy in separation of signals right and left, as with the second embodiment, and it is possible to deflect the secondary electrons so that they impinge on the reflector plate 13 instead of passing through the opening 213 and going upward after passing through the reflector plate 15 in y direction. This secondary electron deflection improves the right and left separation accuracy, and also makes it possible to adjust so that the secondary electrons that have passed through the reflector plate 15 will not be directed upward and lost, but impinge on the reflector plate 13, and thereby to obtain an electronic signal image without signal loss.

This embodiment has the following advantages. If secondary electrons 38 are detected above a scanning deflector 16, the secondary electrons 38 are also deflected through a scanning deflection electric field or magnetic field. Particularly, if secondary electrons 40 are narrowly converged at the height of the reflector plate 13, a phenomenon occurs that the shadow of the opening appears on an image. According to this embodiment, however, since secondary electrons can be deflected in y direction so that they will not go upward through the opening 213, it is possible to obtain a uniform image without the shadow of the opening.

Also, since the loss at the opening is eliminated by deflecting secondary electrons in y direction, it is possible to make the beam passing opening 213 of the reflector plate 1 larger than with the other embodiments. This allows the primary electron beam to travel downward through the reflector plate 13 without impinging on it, even when the primary electron beam is required to be deflected above the reflector plate 13, thus increasing the adjustment range and control capability of the electro-optic system.

What is claimed is:

1. An inspection method using charged particle beam, comprising the steps of:
   scanning a desired area on a specimen with a primary charged particle beam;
   detecting the low angle components of an elevation angle, at a place of generation, of charged particles secondarily generated from said area by irradiating said primary charged particle beam; and
   detecting high angle components of the elevation angle.

2. An inspection method using a charged particle beam according to claim 1, further comprising the step of separating a low angle component of an elevation angle, at a place of generation, of charged particles secondarily generated from said desired area on said specimen into two or more types of azimuth components and then detecting them.

3. An inspection method using a charged particle beam according to claim 1, further comprising the step of obtaining an image in a defect coordinate position on said specimen based on defect coordinate data on said specimen.

4. An inspection method using a charged particle beam according to claim 3, further comprising the step of classifying a defect by obtaining information on image shape, contrast, and asperity, after obtaining said image.

5. An inspection method using a charged particle beam according to claim 1, wherein said charged particle beam is an electron beam.

6. An inspection method using a charged particle beam according to claim 1, further comprising a secondary charged particle alignment step for separating said secondarily generated charged particles into said two or more types of azimuth components, and then detecting them.

7. An inspection method using a charged particle beam according to claim 1, further comprising a secondary charged particles alignment step for deflecting and adjusting said secondarily generated charged particles at a desire inclination independently of a primary charged particle beam, and then detecting them.

8. An inspection method using a charged particle beam according to claim 7, wherein said secondary charged particle alignment step is an alignment step capable of deflecting secondary electrons two or more directions.

9. An inspection apparatus using a charged particle beam, comprising:
   a specimen stage;
   a charged particle source to generate a primary charged particle beam;
   an objective lens to irradiate a primary charge particle beam onto a specimen on said specimen stage;
   an electrode to adjust an electric field on said specimen; and
   means of detecting low angle components of elevation angles and high angle components, at a place of generation, of charged particles secondarily generated from said specimen.

10. An inspection apparatus using a charged particle beam according to claim 9, further comprising a detection unit to separate said low angle components of elevation angles into two or more types of azimuth components and detect them.

11. An inspection apparatus using a charged particle beam according to claim 9 or 10, further comprising a reflector plate on which charged particle secondarily generated from said specimen impinge; and a detector plate to detect secondary electrons generated when said charged particle impinged on said reflector plate.

12. An inspection apparatus using a charge particle beam according to claim 11, wherein said reflector plate or detector plate has an opening with radius of 1 mm or more and 10 mm or less relative to the light axis of said charged particle beam.

13. An inspection apparatus using a charged particle beam according to claim 11, wherein said reflector plate or detector plate has a means of moving itself.

14. An inspection apparatus using a charged particle beam according to claim 9, wherein said detection means includes a semiconductor detector, scintillator, or a multichannel plate.

15. An inspection apparatus using a charged particle beam according to claim 9, further comprising:
   a comparison arithmetic circuit to form an image based on a signal from said detection means, and compare an image to be inspection with an image of another same circuit pattern; and
   an arithmetic circuit to determine defects on the circuit pattern of said specimen based on the comparison result from said comparison arithmetic circuit.

16. An inspection apparatus using a charged particle beam according to claim 15, further comprising a computer that forms images based on signals from said detection means and classifies the images according to defect types.

17. An inspection apparatus using a charged particle beam, comprising:
   a specimen stage on which a specimen is loaded;
   an objective lens to irradiate a primary charged particle beam onto said specimen;
   an electrode to adjust an electric field on said specimen;
   two or more detection units to separate low angle components of secondary charged particles generated from said specimen, as viewed from the place of generation, into two or more types of azimuth components and then detect them
   a detection unit to detect high angle component of said elevation angles; and
   a secondary charged particle deflection means to deflect and adjust said secondary charged particles at a desired inclination independently of a primary charged particle beam.

18. An inspection apparatus using a charged particle beam according of claim 17, wherein said secondary charged particle deflection means is a deflector overlapping electric field and magnetic field.

19. An inspection apparatus using a charged particle beam according to claim 17, wherein said secondary charged particle deflection means is composed of a 4 or more polar electrode and magnetic pole capable of deflecting secondary charged particles in two or more directions.

20. An inspection apparatus using a charged particle beam according to claim 19, wherein the shape of an opening of a reflector plate or detector plate for separating said secondary charged particles according to azimuth, is an ellipse or rectangle with a minor axis in the direction of separating said secondary charged particles according to their azimuth, and a major axis in the direction perpendicular to the minor axis direction.

* * * * *